(12) United States Patent
Tobita et al.

(10) Patent No.: US 12,568,584 B2
(45) Date of Patent: Mar. 3, 2026

(54) WIRING BOARD

(71) Applicant: Murata Manufacturing Co., Ltd., Kyoto (JP)

(72) Inventors: Yoshiki Tobita, Nagaokakyo (JP); Issei Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 305 days.

(21) Appl. No.: 18/359,074

(22) Filed: Jul. 26, 2023

(65) Prior Publication Data

US 2023/0371182 A1    Nov. 16, 2023

Related U.S. Application Data

(63) Continuation of application No. PCT/JP2021/048931, filed on Dec. 28, 2021.

(30) Foreign Application Priority Data

Jan. 29, 2021    (JP) ................................. 2021-013321

(51) Int. Cl.
$H05K\ 1/16$ (2006.01)
$H01F\ 27/28$ (2006.01)
(Continued)

(52) U.S. Cl.
CPC ......... *H05K 1/165* (2013.01); *H01F 27/2804* (2013.01); *H01L 23/49838* (2013.01); (Continued)

(58) Field of Classification Search
CPC ........ H05K 1/165; H05K 1/111; H05K 1/181; H05K 2201/10015; H05K 2201/10022; H05K 2201/1003; H05K 2201/10166 (Continued)

(56) References Cited

U.S. PATENT DOCUMENTS 11,659,650 B2 *  5/2023  Scogna ................ H05K 3/4644
174/250
2008/0001287 A1 *  1/2008  Nakashiba .............. H01L 24/17
257/734
(Continued)

FOREIGN PATENT DOCUMENTS

JP        2008-205422 A        9/2008
JP        2009-218469 A        9/2009
(Continued)

OTHER PUBLICATIONS

International Search Report for PCT/JP2021/048931 dated Mar. 29, 2022.

*Primary Examiner* — Timothy J Thompson
*Assistant Examiner* — Sidi M Maiga
(74) *Attorney, Agent, or Firm* — McDonald Hopkins LLC

(57) ABSTRACT

To provide wiring board capable of reducing influence of variation in size of conductive member on coil conductor. Wiring board according to present disclosure includes insulating layer, plurality of land electrodes formed on lower surface of insulating layer, solder ball formed on surface of at least one of plurality of land electrodes, and coil conductor provided inside insulating layer and having winding axis intersecting lower surface. Plurality of land electrodes includes electrode at a position overlapped opening of coil conductor in plan view seen at the wiring board from lower surface side, and second electrode at a position deviated from opening of coil conductor in plan view. Area of first electrode is larger than area of second electrode in plan view.

20 Claims, 9 Drawing Sheets

(51) Int. Cl.

| | |
|---|---|
| *H01L 23/498* | (2006.01) |
| *H05K 1/11* | (2006.01) |
| *H05K 1/181* | (2026.01) |
| *H01L 23/00* | (2006.01) |
| *H01L 25/16* | (2023.01) |

(52) U.S. Cl.

CPC ............. *H05K 1/111* (2013.01); *H05K 1/181* (2013.01); *H01F 2027/2809* (2013.01); *H01F 27/2885* (2013.01); *H01L 24/16* (2013.01); *H01L 25/16* (2013.01); *H01L 2224/16227* (2013.01); *H05K 2201/094* (2013.01); *H05K 2201/10015* (2013.01); *H05K 2201/10022* (2013.01); *H05K 2201/1003* (2013.01); *H05K 2201/10166* (2013.01); *H05K 2201/10234* (2013.01); *H05K 2201/10522* (2013.01)

(58) Field of Classification Search

USPC ......................................................... 361/765
See application file for complete search history.

(56) References Cited

U.S. PATENT DOCUMENTS

| | | | |
|---|---|---|---|
| 2008/0211067 A1 | 9/2008 | Nakashiba | |
| 2013/0113595 A1* | 5/2013 | Otsubo | ............... H01F 17/0013 |
| | | | 336/200 |
| 2018/0211765 A1 | 7/2018 | Nakaniwa et al. | |

FOREIGN PATENT DOCUMENTS

| | | | |
|---|---|---|---|
| JP | 5103032 | B2 | 12/2012 |
| WO | 2016/136653 | A1 | 9/2016 |
| WO | 2017/006784 | A1 | 1/2017 |
| WO | 2017/110460 | A1 | 6/2017 |

\* cited by examiner

WIRING BOARD

CROSS REFERENCE TO RELATED APPLICATION

This is a continuation of International Application No. PCT/JP2021/048931 filed on Dec. 28, 2021 which claims priority from Japanese Patent Application No. 2021-013321 filed on Jan. 29, 2021. The contents of these applications are incorporated herein by reference in their entireties.

BACKGROUND OF THE DISCLOSURE

Field of the Disclosure

The present disclosure relates to a wiring board including a coil conductor and a conductive member.

Description of the Related Art

A board having a coil conductor is disclosed in Patent Document 1. The board includes a thin film inductive element having a spiral shape as a coil conductor. In addition, on the board, solder balls are provided as conductive members on the thin film inductive element.

Patent Document 1: JP 2009-218469 A

BRIEF SUMMARY OF THE DISCLOSURE

The solder ball faces the thin film inductive element in the direction of the winding axis of the thin film inductive element. Therefore, the solder ball affects a magnetic flux formed when a current flows through the thin film inductive element.

When a large number of boards are manufactured, the diameters of the solder balls formed on the respective boards vary. When the diameter of the solder ball varies, the magnetic flux formed by the thin film inductive element varies for each board. That is, due to variations in the diameters of the solder balls, variations occur in the performance of many manufactured boards.

Therefore, a possible benefit of the present disclosure is to solve the above problem, and to provide a wiring board capable of reducing an influence of variation in size of a conductive member on a coil conductor.

In order to achieve the above possible benefit, the present disclosure is configured as follows. A wiring board according to one aspect of the present disclosure includes: at least one insulating layer; a plurality of land electrodes formed on a first surface of the insulating layer; a conductive member formed on a surface of at least one of the plurality of land electrodes; and a coil conductor provided inside the insulating layer or on a second surface on a back side of the first surface in the insulating layer and having a winding axis intersecting the first surface, in which the plurality of land electrodes includes: a first electrode at a position where at least a part of the first electrode overlaps an opening of the coil conductor in plan view seen from the first surface side; and a second electrode at a position deviated from the opening of the coil conductor in plan view seen from the first surface side, and an area of the first electrode is larger than an area of the second electrode in plan view seen from the first surface side.

According to the present disclosure, it is possible to reduce the influence of the variation in size of the conductive member on the coil conductor.

DETAILED DESCRIPTION OF THE DISCLOSURE

Figure 1:
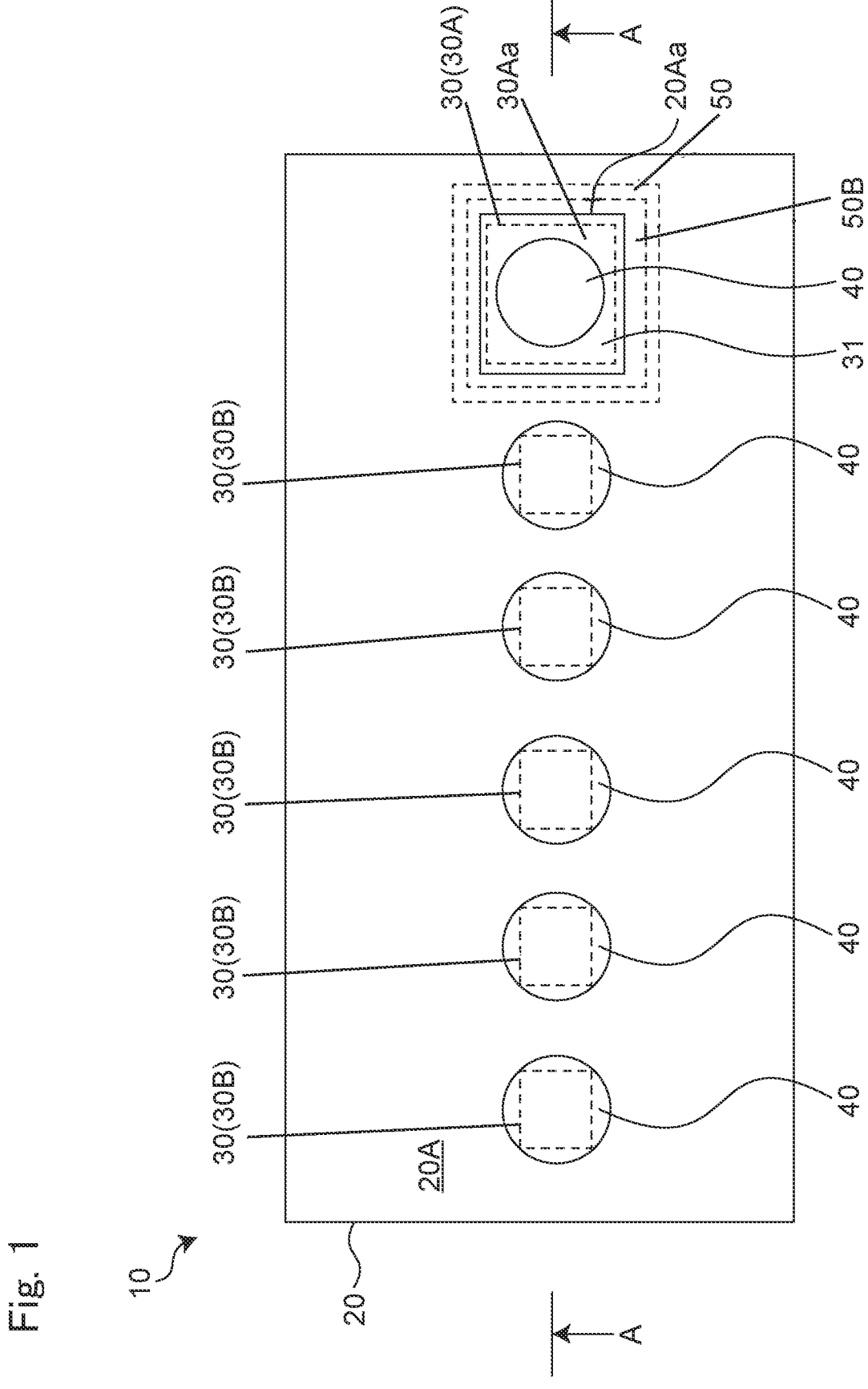
FIG. 1 is a bottom view of a wiring board according to a first embodiment of the present disclosure.

A wiring board according to one aspect of the present disclosure includes: at least one insulating layer; a plurality of land electrodes formed on a first surface of the insulating layer; a conductive member formed on a surface of at least one of the plurality of land electrodes; and a coil conductor provided inside the insulating layer or on a second surface on a back side of the first surface in the insulating layer and having a winding axis intersecting the first surface, in which the plurality of land electrodes includes: a first electrode at a position where at least a part of the first electrode overlaps an opening of the coil conductor in plan view seen from the first surface side; and a second electrode at a position deviated from the opening of the coil conductor in plan view seen from the first surface side, and an area of the first electrode is larger than an area of the second electrode in plan view seen from the first surface side.

The variation in size of the conductive member formed on the surface of each land electrode may affect the magnetic flux formed by the coil conductor.

The variation in size of the land electrode is smaller than the variation in size of the conductive member. Therefore, the influence of the variation in size of the land electrode on the magnetic flux formed by the coil conductor is smaller than the influence of the variation in size of the conductive member on the magnetic flux formed by the coil conductor.

The variation in size of the conductive member located behind the land electrode as viewed from the coil conductor has little influence on the magnetic flux formed by the coil conductor. On the other hand, the variation in size of the conductive member that is not located behind the land electrode but is located outside the land electrode as viewed from the coil conductor greatly affects the magnetic flux formed by the coil conductor.

According to this configuration, in plan view seen from the first surface side, the first electrode of the land electrode is at a position overlapping the opening of the coil conductor. Therefore, the variation in size of the conductive member formed on the first electrode can greatly affect the magnetic flux formed by the coil conductor. On the other hand, in plan view seen from the first surface side, the second electrode of the land electrode is at a position deviated from the opening of the coil conductor. Therefore, the conductive member formed on the second electrode does not greatly affect the magnetic flux formed by the coil conductor.

According to this configuration, the area of the first electrode is larger than the area of the second electrode in plan view seen from the first surface side. Therefore, when the size of the conductive member varies, the protrusion of the conductive member formed on the first electrode to the outside of the first electrode can be reduced as compared with the protrusion of the conductive member formed on the second electrode to the outside of the second electrode. Therefore, the influence of the variation in size of the conductive member on the magnetic flux formed by the coil conductor can be reduced.

In plan view seen from the first surface side, an area of the conductive member formed on a surface of the first electrode may be smaller than an area of the first electrode.

According to this configuration, the area of the conductive member formed on the first electrode is smaller than the area of the first electrode in plan view seen from the first surface side. Therefore, the conductive member is less likely to be located outside the first electrode when viewed from the coil conductor. Therefore, the influence of the variation in size of the conductive member on the magnetic flux formed by the coil conductor can be reduced.

In plan view seen from the first surface side, the entire portion of the conductive member formed on the surface of the first electrode may overlap the first electrode.

According to this configuration, when viewed from the coil conductor, the entire portion of the conductive member is located behind the first electrode. Therefore, the influence of the variation in size of the conductive member on the magnetic flux formed by the coil conductor can be reduced.

The wiring board according to one aspect of the present disclosure may further include an insulating covering portion that covers an outer edge portion of the first electrode in plan view seen from the first surface side, and the conductive member may be surrounded by the covering portion in the first electrode in plan view seen from the first surface side.

According to this configuration, the covering portion reduces the situation in which the conductive member formed on the surface of the first electrode wets and spreads and is positioned outside the first electrode.

The plurality of land electrodes may include a plurality of the first electrodes at positions overlapping the opening of the coil conductor in plan view seen from the first surface side.

According to this configuration, when there is a variation in size of the conductive member formed in each of the plurality of first electrodes, it is possible to reduce the influence of the variation on the magnetic flux formed by the coil conductor.

The wiring board according to one aspect of the present disclosure may further include a first sealing resin provided on the first surface of the insulating layer and covering a part of the conductive member.

According to this configuration, the conductive member can be stably fixed to the land electrode by the first sealing resin.

The wiring board according to one aspect of the present disclosure may further include at least one electronic component mounted on the second surface of the insulating layer.

The wiring board according to one aspect of the present disclosure may further include a second sealing resin provided on the second surface of the insulating layer and covering at least a part of the electronic component.

According to this configuration, the electronic component can be stably fixed to the insulating layer by the second sealing resin.

The coil conductor may be provided inside the insulating layer, and the electronic component may be at a position deviated from the opening of the coil conductor in plan view seen from the second surface side.

According to this configuration, in plan view seen from the second surface side, the electronic component is at a position deviated from the opening of the coil conductor. Therefore, the influence of the magnetic flux formed by the coil conductor on the electronic component can be reduced.

The coil conductor may be provided inside the insulating layer. In addition, the electronic component may include an overlapping component at least partially overlapping the opening of the coil conductor in plan view seen from the second surface side, and a non-overlapping component at a position deviated from the opening of the coil conductor in plan view seen from the second surface side. In addition, each of the overlapping component and the non-overlapping component may include at least one conductive portion exposed to the outside. In addition, each of the conductive portions may be connected to any one of the plurality of land electrodes. In addition, the plurality of land electrodes may further include: a third electrode formed on the second surface of the insulating layer, at a position overlapping the opening of the coil conductor in plan view seen from the second surface side, and connected with the conductive portion of the overlapping component; and a fourth electrode formed on the second surface of the insulating layer, at a position deviated from the opening of the coil conductor in plan view seen from the second surface side, and connected with the conductive portion of the overlapping component or the conductive portion of the non-overlapping component at a position deviated from the opening of the coil conductor in the conductive portion of the overlapping component. In addition, in plan view seen from the second surface side, an area of the third electrode may be larger than an area of the fourth electrode.

According to this configuration, in plan view seen from the second surface side, the third electrode is at a position overlapping the opening of the coil conductor. Therefore, the conductive portion connected to the third electrode can greatly affect the magnetic flux formed by the coil conductor. On the other hand, in plan view seen from the second surface side, the fourth electrode is at a position deviated from the opening of the coil conductor. Therefore, the conductive portion connected to the fourth electrode does not greatly affect the magnetic flux formed by the coil conductor.

According to this configuration, the area of the third electrode is larger than the area of the fourth electrode in plan view seen from the second surface side. Therefore, when the size of the conductive portion varies, the protrusion of the conductive portion connected to the third electrode to the outside of the third electrode can be reduced as compared with the protrusion of the conductive portion connected to the fourth electrode to the outside of the fourth electrode. Therefore, the influence of the variation in size of the conductive portion on the magnetic flux formed by the coil conductor can be reduced.

The coil conductor may be provided inside the insulating layer. In addition, the electronic component may include an overlapping component at least partially overlapping the opening of the coil conductor in plan view seen from the second surface side, and a non-overlapping component at a position deviated from the opening of the coil conductor in plan view seen from the second surface side. In addition, each of the overlapping component and the non-overlapping component may include at least one conductive portion exposed to the outside. In addition, each of the conductive portions may be connected to any one of the plurality of land electrodes. In addition, the plurality of land electrodes may further include: a third electrode formed on the second surface of the insulating layer, at a position overlapping the opening of the coil conductor in plan view seen from the second surface side, and connected with the conductive portion of the overlapping component; and a fourth electrode formed on the second surface of the insulating layer, at a position deviated from the opening of the coil conductor in plan view seen from the second surface side, and connected with the conductive portion of the overlapping component or the conductive portion of the non-overlapping component at a position deviated from the opening of the coil conductor in the conductive portion of the overlapping component. In addition, in plan view seen from the second surface side, an area of the conductive portion connected to the third electrode may be smaller than an area of the conductive portion connected to the fourth electrode.

According to this configuration, in plan view seen from the second surface side, the third electrode is at a position overlapping the opening of the coil conductor. Therefore, the conductive portion connected to the third electrode can greatly affect the magnetic flux formed by the coil conductor. On the other hand, the fourth electrode is at a position deviated from the opening of the coil conductor in plan view. Therefore, the conductive portion connected to the fourth electrode does not greatly affect the magnetic flux formed by the coil conductor.

According to this configuration, the area of the conductive portion connected to the third electrode is smaller than the area of the conductive portion connected to the fourth electrode in plan view. Therefore, when there is a variation in size of the conductive portion, the variation in size of the conductive portion connected to the third electrode can be made smaller than the variation in size of the conductive portion connected to the fourth electrode. Therefore, the influence of the variation in size of the conductive portion on the magnetic flux formed by the coil conductor can be reduced.

In plan view seen from the second surface side, an area of the conductive portion connected to the third electrode may be smaller than an area of the third electrode.

According to this configuration, the area of the conductive portion formed in the third electrode is smaller than the area of the third electrode in plan view seen from the second surface side. Therefore, the conductive portion is less likely to be located outside the third electrode as viewed from the coil conductor. Therefore, the influence of the variation in size of the conductive portion on the magnetic flux formed by the coil conductor can be reduced.

In plan view seen from the second surface side, the entire portion of the conductive portion connected to the third electrode may overlap the third electrode.

According to this configuration, when viewed from the coil conductor, the entire portion of the conductive portion is located behind the third electrode. Therefore, the influence of the variation in size of the conductive portion on the magnetic flux formed by the coil conductor can be reduced.

Hereinafter, embodiments of the present disclosure will be described with reference to the drawings. Note that the present disclosure is not limited to the following embodiments.

In addition, in the drawings, substantially the same elements are denoted by the same reference numerals, and description thereof is omitted.

Hereinafter, for convenience of description, terms indicating directions such as "upper surface", "lower surface", and "vertical direction" are used, but these terms are not intended to limit a use state or the like of the electronic component according to the present disclosure.

First Embodiment

Figure 2:
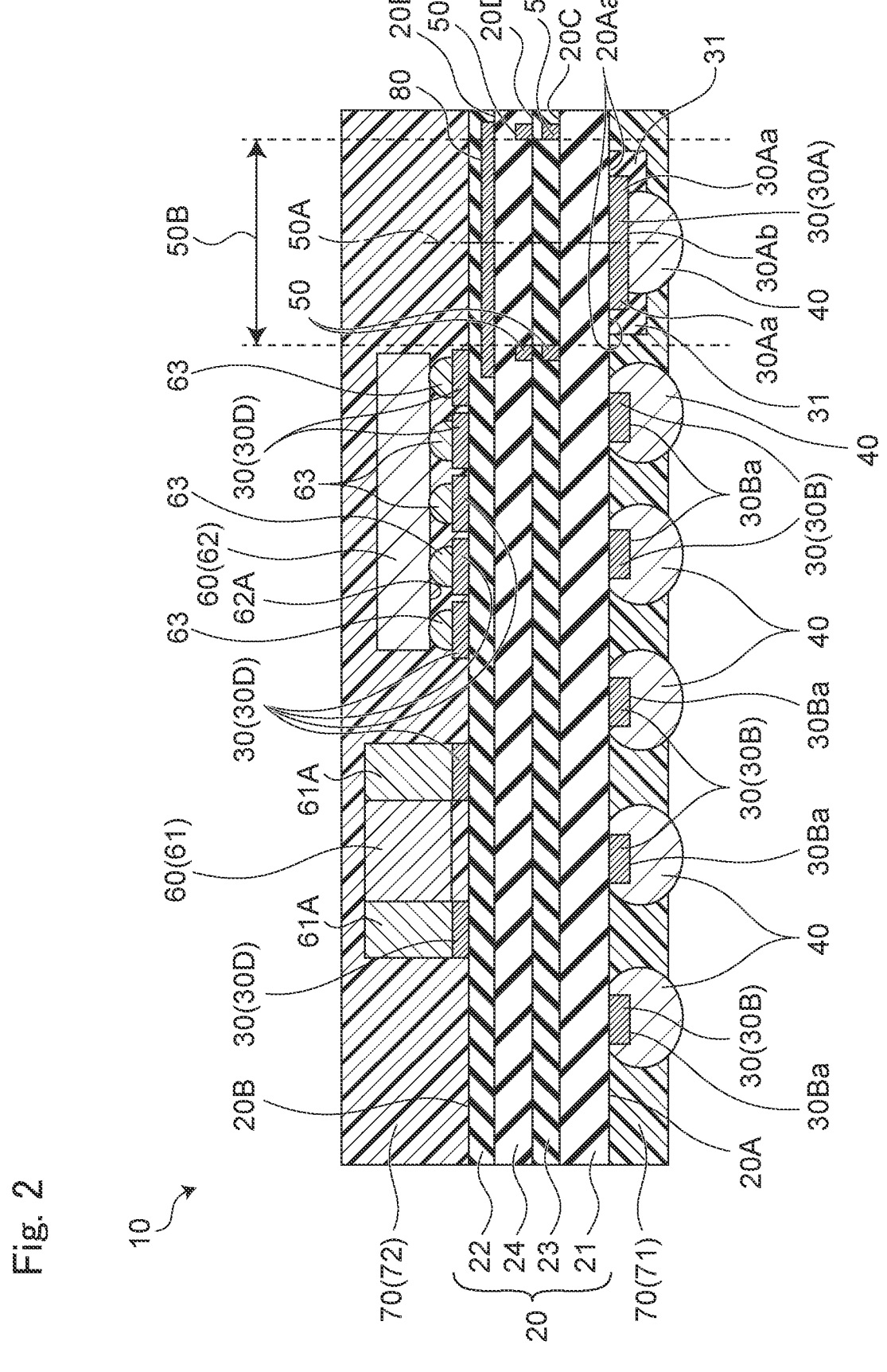
FIG. 2 is a cross-sectional view illustrating a cross section taken along line A-A in FIG. 1.

FIG. 1 is a bottom view of a wiring board according to a first embodiment of the present disclosure. FIG. 2 is a cross-sectional view illustrating a cross section taken along line A-A in FIG. 1.

As illustrated in FIGS. 1 and 2, a wiring board 10 includes an insulating layer 20, a land electrode 30, a solder ball 40, a coil conductor 50, a ground conductor 80, an electronic component 60, and a sealing resin 70.

The insulating layer 20 is a base material of an insulator made of ceramic such as alumina, or resin such as glass epoxy, Teflon (registered trademark), or paper phenol.

In the first embodiment, as illustrated in FIG. 2, the insulating layer 20 includes four layers. The insulating layer 20 includes a first surface layer 21, a second surface layer 22, and intermediate layers 23 and 24 laminated between the first surface layer 21 and the second surface layer 22. The intermediate layer 23 is laminated on the first surface layer 21. The intermediate layer 24 is laminated on the side of the intermediate layer 23 opposite to the first surface layer 21. The second surface layer 22 is laminated on the side of the intermediate layer 24 opposite to the intermediate layer 23.

The surface on a side of the first surface layer 21 opposite to the intermediate layer 23 constitutes a lower surface 20A of the insulating layer 20. The lower surface 20A is an example of the first surface. The surface on a side of the second surface layer 22 opposite to the intermediate layer 24 constitutes an upper surface 20B of the insulating layer 20. The upper surface 20B is an example of the second surface. The lower surface 20A and the upper surface 20B are exposed to the outside of the insulating layer 20. That is, the lower surface 20A and the upper surface 20B are surfaces of the insulating layer 20, and the upper surface 20B is a back surface of the lower surface 20A.

As illustrated in FIG. 2, a plurality of land electrodes 30 are formed on the lower surface 20A and the upper surface 20B of the insulating layer 20.

When the insulating layer 20 is made of ceramic, the land electrode 30 is obtained by co-firing a conductive paste printed on the lower surface 20A and the upper surface 20B of the insulating layer 20 with the insulating layer 20. In this case, the land electrode 30 is made of, for example, copper. When the insulating layer 20 is made of resin, the land electrodes 30 are formed on the lower surface 20A and the upper surface 20B of the insulating layer 20 by a known means such as etching. In this case, the land electrode 30 is made of metal foil, for example.

In the first embodiment, the wiring board 10 includes 13 land electrodes 30. The land electrode 30 includes one electrode 30A, five electrodes 30B, and seven electrodes 30D. The electrode 30A is an example of the first electrode. The electrode 30B is an example of the second electrode. The electrode 30D is an example of the fourth electrode.

As illustrated in FIGS. 1 and 2, the electrodes 30A and 30B are formed on the lower surface 20A of the insulating layer 20. The electrode 30D is formed on the upper surface 20B of the insulating layer 20.

In plan view of the wiring board 10 as viewed from below, in other words, in plan view of the wiring board 10 as viewed from the lower surface 20A side of the insulating layer 20, the area of the electrode 30A is larger than the area of the electrode 30B.

As illustrated in FIGS. 1 and 2, an insulating resist film 31 is formed on the lower surface 20A of the insulating layer 20. The resist film 31 is an example of the covering portion.

As illustrated in FIG. 1, the resist film 31 covers the outer edge portion 30Aa of the electrode 30A in plan view of the wiring board 10 as viewed from the lower surface 20A side of the insulating layer 20. The outer edge portion 30Aa of the electrode 30A is a portion excluding the central portion of the electrode 30A in the plan view. In other words, the outer edge portion 30Aa of the electrode 30A is a side of a square constituting the electrode 30A in the plan view and a peripheral portion inside the side of the square.

In addition, the resist film 31 covers a peripheral portion 20Aa of the electrode 30A on the lower surface 20A of the insulating layer 20. The peripheral portion 20Aa is a peripheral portion outside the side of the square constituting the electrode 30A.

The outer edge portion 30Aa of the electrode 30A and the peripheral portion 20Aa of the electrode 30A on the lower surface 20A are continuous. That is, the resist film 31 covers the outer edge portion 30Aa of the electrode 30A and the peripheral portion 20Aa of the electrode 30A on the lower surface 20A in a straddling manner.

As illustrated in FIGS. 1 and 2, the wiring board 10 includes six solder balls 40. The solder ball 40 is an example of a conductive member. The solder ball 40 is made of solder and has a substantially spherical shape.

The solder balls 40 are formed on a surface 30Ab of one electrode 30A and a surface 30Ba of five electrodes 30B. The surface 30Ab of the electrode 30A is a surface of the electrode 30A opposite to the first surface layer 21. A surface 30Ba of the electrode 30B is a surface on a side of the electrode 30B opposite to the first surface layer 21.

One of the six solder balls 40 is formed at the center of the surface 30Ab of the electrode 30A. On the other hand, the solder ball 40 is not formed on the outer edge portion 30Aa of the electrode 30A covered with the resist film 31. That is, as illustrated in FIG. 1, in plan view of the wiring board 10 as viewed from the lower surface 20A side of the insulating layer 20, an area of the solder ball 40 formed on the surface 30Ab of the electrode 30A is smaller than an area of the surface 30Ab of the electrode 30A. In addition, in the plan view, the entire portion of the solder ball 40 formed on the surface 30Ab of the electrode 30A overlaps the electrode 30A.

The other five of the six solder balls 40 are formed so as to cover the entire surface 30Ba of the electrode 30B.

The number of the solder balls 40 is not limited to 6. At least one solder ball 40 may be provided.

As illustrated in FIG. 2, the coil conductor 50 is formed on inner surfaces 20C and 20D of the insulating layer 20. That is, in the first embodiment, the coil conductor 50 is provided inside the insulating layer 20. The ground conductor 80 is formed on an inner surface 20E of the insulating layer 20. The inner surface 20C is an upper surface of the first surface layer 21. The inner surface 20D is an upper surface of the intermediate layer 23. The inner surface 20E is an upper surface of the intermediate layer 24.

When the insulating layer 20 is made of ceramic, the coil conductor 50 and the ground conductor 80 are formed by co-firing a conductive paste printed on the insulating layer 20 with the insulating layer 20. In this case, the coil conductor 50 and the ground conductor 80 are made of, for example, copper. When the insulating layer 20 is made of resin, the coil conductor 50 and the ground conductor 80 are formed on the inner surfaces 20C, 20D, and 20E of the insulating layer 20 by known means such as etching. In this case, the coil conductor 50 and the ground conductor 80 are made of, for example, metal foil.

As illustrated in FIG. 1, in plan view of the wiring board 10 as viewed from the lower surface 20A side of the insulating layer 20, each of the coil conductors 50 formed on the inner surfaces 20C and 20D of the insulating layer 20 has a loop shape. Although not illustrated, the coil conductor 50 formed on the inner surface 20C of the insulating layer 20 and the coil conductor 50 formed on the inner surface 20D of the insulating layer 20 are electrically connected to each other by a known means such as a via conductor (not illustrated).

In the case of a resin board, a via conductor is formed by plating a conductive metal made of copper or the like in a through hole penetrating a layer (first surface layer 21, second surface layer 22, and intermediate layers 23 and 24) constituting the insulating layer 20, or in the case of a ceramic board, the via conductor is filled with a conductive paste and co-fired with a ceramic.

With the above configuration, in the first embodiment, the coil conductor 50 functions as a coil formed around a winding axis 50A extending along the lamination direction (vertical direction) of the insulating layer 20. The winding axis 50A of the coil conductor 50 is orthogonal to the lower surface 20A and the upper surface 20B of the insulating layer 20. Further, the winding axis 50A of the coil conductor 50 may cross the lower surface 20A and the upper surface 20B of the insulating layer 20. For example, the winding axis 50A of the coil conductor 50 may extend in a direction inclined with respect to the vertical direction.

The coil conductor 50 has an opening 50B. The opening 50B is a region inside the coil conductor 50 having a loop shape in plan view of the wiring board 10 as viewed from the lower surface 20A side of the insulating layer 20.

As illustrated in FIGS. 1 and 2, in plan view of the wiring board 10 as viewed from the lower surface 20A side of the insulating layer 20, the entire electrode 30A is at a position overlapping an opening 50B of the coil conductor 50. On the other hand, in the plan view, the electrode 30B is at a position deviated from the opening 50B of the coil conductor 50.

As illustrated in FIG. 2, in plan view of the wiring board 10 as viewed from the lower surface 20A side of the insulating layer 20, the coil conductor 50 is located inside the ground conductor 80. That is, in the plan view, the ground conductor 80 completely covers the opening 50B of the coil conductor 50 from above.

As a result, the ground conductor 80 can shield the magnetic flux formed when the current flows through the coil conductor 50. The ground conductor 80 is located above the coil conductor 50. Therefore, it is possible to reduce the influence of the magnetic flux on an object (for example, the electronic component 60) located above the coil conductor 50.

As illustrated in FIG. 2, the wiring board 10 includes two electronic components 61 and 62 as the electronic component 60. Each of the two electronic components 61 and 62 is various known components such as a resistor, a capacitor, a transistor, and an integrated circuit.

The two electronic components 61 and 62 are mounted on the upper surface 20B of the insulating layer 20. The electronic component 61 includes conductive portions 61A on both left and right ends. The electronic component 61 is electrically connected to the electrode 30D via the conductive portion 61A. Note that the electronic component 61 may include at least one conductive portion 61A.

The electronic component 62 includes solder balls 63 exposed to the outside. Similarly to the solder ball 40, the solder ball 63 is made of solder and has a substantially spherical shape. The electronic component 62 is electrically connected to the electrode 30D via the solder ball 63. The solder ball 63 is an example of a conductive portion.

A plurality of solder balls 63 are formed on a lower surface 62A of the electronic component 62. Although five solder balls 63 are illustrated in FIG. 2, the electronic component 62 may include at least one solder ball 63. In the first embodiment, the solder ball 63 is smaller than the solder ball 40, but the solder ball 63 may be larger than or equal to the solder ball 40. Each of the solder balls 63 is electrically connected to the electrode 30D.

In the first embodiment, the electronic components 61 and 62 and the solder ball 63 are at positions deviated from the opening 50B of the coil conductor 50 in plan view of the wiring board 10 as viewed from above, in other words, in plan view of the wiring board 10 as viewed from the upper surface 20B side of the insulating layer 20.

As illustrated in FIG. 2, the wiring board 10 includes a sealing resin 70. The sealing resin 70 is made of a resin such as an epoxy resin. The wiring board 10 includes sealing resins 71 and 72 as the sealing resin 70. The sealing resin 71 is an example of a first sealing resin. The sealing resin 72 is an example of a second sealing resin. Note that, in FIG. 1 and FIGS. 3, 4, 6, and 7 described later, the sealing resin 71 is not illustrated.

As illustrated in FIG. 2, the sealing resin 71 is provided on the lower surface 20A of the insulating layer 20. The sealing resin 71 covers the electrodes 30A and 30B and the resist film 31. In addition, the sealing resin 71 covers a part of the solder ball 40. More specifically, the lower end portion of the solder ball 40 is not covered with the sealing resin 71 and is located below the sealing resin 71. On the other hand, a portion other than the lower end portion of the solder ball 40 is covered with the sealing resin 71.

The sealing resin 72 is provided on the upper surface 20B of the insulating layer 20. The sealing resin 72 covers the electrode 30D and the electronic component 60. Note that the sealing resin 72 may cover only a part of the electronic component 60. For example, the upper surface of the electronic component 60 may be exposed to the outside without being covered with the sealing resin 72.

The variation in size of the solder ball 40 formed on the surface 30Ab of each land electrode 30 may affect the magnetic flux formed by the coil conductor 50.

The variation in size of the land electrode 30 is smaller than the variation in size of the solder ball 40. Therefore, the influence of the variation in size of the land electrode 30 on the magnetic flux formed by the coil conductor 50 is smaller than the influence of the variation in size of the solder ball 40 on the magnetic flux formed by the coil conductor 50.

The variation in size of the solder ball 40 located behind the land electrode 30 as viewed from the coil conductor 50 has little influence on the magnetic flux formed by the coil conductor 50. On the other hand, a variation in size of the solder ball 40 that is not located behind the land electrode 30 but is located outside the land electrode 30 as viewed from the coil conductor 50 greatly affects the magnetic flux formed by the coil conductor 50.

According to the first embodiment, in plan view of the wiring board 10 as viewed from the lower surface 20A side of the insulating layer 20, the electrode 30A is at a position overlapping the opening 50B of the coil conductor 50. Therefore, the variation in size of the solder ball 40 formed in the electrode 30A can greatly affect the magnetic flux formed by the coil conductor 50. On the other hand, in the plan view, the electrode 30B is at a position deviated from the opening 50B of the coil conductor 50. Therefore, the variation in size of the solder ball 40 formed in the electrode 30B does not greatly affect the magnetic flux formed by the coil conductor 50.

According to the first embodiment, in plan view of the wiring board 10 as viewed from the lower surface 20A side of the insulating layer 20, the area of the electrode 30A is larger than the area of the electrode 30B. Therefore, when the size of the solder ball 40 varies, the protrusion of the solder ball 40 formed on the electrode 30A to the outside of the electrode 30A can be reduced as compared with the protrusion of the solder ball 40 formed on the electrode 30B to the outside of the electrode 30B. Therefore, it is possible to reduce the influence of the variation in size of the solder ball 40 on the magnetic flux formed by the coil conductor 50.

According to the first embodiment, in plan view of the wiring board 10 as viewed from the lower surface 20A side of the insulating layer 20, the area of the solder ball 40 formed in the electrode 30A is smaller than the area of the electrode 30A. Therefore, it is difficult for the solder ball 40 to be positioned outside the electrode 30A as viewed from the coil conductor 50. Therefore, it is possible to reduce the influence of the variation in size of the solder ball 40 on the magnetic flux formed by the coil conductor 50.

According to the first embodiment, when viewed from the coil conductor 50, the entire portion of the solder ball 40 is located behind the electrode 30A. Therefore, it is possible to reduce the influence of the variation in size of the solder ball 40 on the magnetic flux formed by the coil conductor 50.

According to the first embodiment, the resist film 31 reduces the possibility that the solder formed on the surface of the electrode 30A wets and spreads and is located outside the electrode 30A.

According to the first embodiment, the solder ball 40 can be stably fixed to the land electrode 30 by the sealing resin 71.

According to the first embodiment, the electronic component 60 can be stably fixed to the insulating layer 20 by the sealing resin 72.

According to the first embodiment, in plan view of the wiring board 10 as viewed from the upper surface 20B side of the insulating layer 20, the electronic component 60 is at a position deviated from the opening 50B of the coil conductor 50. Therefore, the influence of the magnetic flux formed by the coil conductor 50 on the electronic component 60 can be reduced.

Hereinafter, an example of a method for manufacturing the wiring board 10 will be described.

The wiring board 10 is divided by cutting a stacked body. The stacked body is formed by integrating a plurality of wiring boards 10 in an arranged state. In the following description, a method of manufacturing one wiring board 10 constituting the stacked body will be described. In addition, in the following description, it is assumed that the insulating layer 20 of the wiring board 10 is made of ceramic.

First, a sheet forming step is performed. In the sheet forming step, sheets corresponding to the four layers (first surface layer 21, second surface layer 22, and intermediate layers 23 and 24) constituting the insulating layer 20 are formed as described in detail below. A slurry is made by mixing the ceramic powder, binder, and plasticizer in any amount. The slurry is applied onto the carrier film to form a sheet. The slurry is applied using a lip coater, a doctor blade, and the like. As the carrier film, for example, a PET (polyethylene terephthalate) film or the like is used. The thickness of each sheet is, for example, such that the thickness after firing is 1 to 150 μm.

Next, a via conductor forming step is performed. In the via conductor forming step, the via conductors are formed as described in detail below. Any number of through holes are formed in each sheet. Of course, when the sheet does not need a through hole, the through hole is not formed in the sheet. Each through hole is formed by, for example, a mechanical punch, a UV laser, a $CO_2$ laser, or the like. Each through hole is filled with a conductive paste. As a result, the via conductor is formed. The conductive paste is prepared, for example, by mixing raw materials containing conductive powders, a plasticizer, and a binder. For example, a eutectic material such as ceramic powders mixed in each sheet may be added to the conductive paste in order to adjust the shrinkage rate during firing. The via conductor can constitute a part of the coil conductor 50 as described above. Note that, in each drawing, illustration of via conductors is omitted.

Next, an electrode forming step is performed. In the electrode forming step, the land electrode 30 (electrodes 30A and 30B) is formed on the sheet corresponding to the first surface layer 21 among the four sheets. The land electrode 30 (electrode 30D) is formed on a sheet corresponding to the second surface layer 22 among the four sheets. In addition, the coil conductor 50 is formed on a sheet corresponding to the first surface layer 21 and the intermediate layer 23 among the four sheets. In addition, the ground conductor 80 is formed on a sheet corresponding to the intermediate layer 24 among the four sheets. In plan view of the wiring board 10 as viewed from the lower surface 20A of the insulating layer 20, a length of one side of the land electrode 30 is, for example, 30 μm or more.

The land electrode 30, the coil conductor 50, and the ground conductor 80 are formed by, for example, printing a conductive paste. Examples of the printing include screen printing, inkjet printing, and gravure printing. Wiring such as a signal line and a power line may be formed on each sheet similarly to the coil conductor 50 and the ground conductor 80.

Although the conductive paste material constituting the via conductor, the coil conductor 50, and the ground conductor 80 described above is arbitrary, the conductive paste for forming the coil conductor 50 and the via conductor constituting a part of the coil conductor 50 is preferably a pure copper paste.

Next, a resist film forming step is executed. In the resist film forming step, the resist film 31 is formed on a sheet corresponding to the first surface layer 21 among the four sheets. The resist film 31 is formed so as to cover the outer edge portion 30Aa of the electrode 30A and the peripheral portion 20Aa of the electrode 30A on the lower surface 20A. The resist film 31 is printed on a sheet in the same manner as the conductive paste described above.

Next, a lamination step is performed. In the laminating step, the respective sheets from which the carrier film has been removed are laminated, and subjected to pressure bonding and firing in a mold. After firing, each of the laminated sheets is plated. The plating is, for example, Ni—Sn plating or Ni-electroless Au plating. As a result, the insulating layer 20 is obtained.

Next, a mounting step is performed. In the mounting step, the electronic component 60 (electronic components 61 and 62) is mounted on the upper surface 20B of insulating layer 20. The implementation is performed by known means. After implementation, a reflow process is performed. The insulating layer 20 may be cleaned with an organic cleaning liquid or the like after the reflow treatment.

Next, a solder ball forming step is performed. In the solder ball forming step, the solder ball 40 is formed on the lower surface 20A of the insulating layer 20. The solder ball 40 is formed by a known means. As in the case of mounting the electronic component 60, reflow processing and cleaning may be executed after the formation of the solder ball 40.

Next, a coating step is performed. In the covering step, the sealing resin 70 is covered with the insulating layer 20. Specifically, the lower surface 20A of the insulating layer 20 is covered with the sealing resin 71, and the upper surface 20B of the insulating layer 20 is covered with the sealing resin 72. As a result, the sealing resin 71 covers the electrodes 30A and 30B, the resist film 31, and a portion other than the lower end portion of the solder ball 40. In addition, the sealing resin 72 covers the electrode 30D and the electronic component 60.

Next, a dicing step is performed. In the dicing step, the above-described dicing is executed. Thus, a plurality of wiring boards 10 are prepared.

In the first embodiment, the insulating layer 20 includes four layers as illustrated in FIG. 2, but may include layers other than the four layers. The insulating layer 20 may include at least one layer.

The thicknesses of the respective layers (first surface layer 21, second surface layer 22, and intermediate layers 23 and 24) of the insulating layer 20 may be different from each other, or the thicknesses of at least two insulating layers 20 may be the same.

The number of land electrodes 30 is not limited to 13. The wiring board 10 may include the plurality of land electrodes 30. The number of electrodes 30A is not limited to 1. The number of the electrodes 30B is not limited to 5. The number of the electrodes 30D is not limited to 7. The wiring board 10 may include at least one of the electrodes 30A and 30B. The wiring board 10 may not include the electrode 30D.

In the first embodiment, in plan view of the wiring board 10 as viewed from the lower surface 20A side of the insulating layer 20, the entire electrode 30A is at a position overlapping the opening 50B of the coil conductor 50, but the present disclosure is not limited thereto. In the plan view, only a part of the electrode 30A may be at a position overlapping the opening 50B of the coil conductor 50.

In the first embodiment, the resist film 31 corresponds to a covering portion. However, the covering portion is not limited to the resist film 31 as long as it has insulating properties. For example, the covering portion may be a glass film. In addition, the covering portion may also be formed on the electrodes 30B and 30D and an electrode 30C to be described later in the same manner as the electrode 30A.

In the first embodiment and each embodiment described later, the solder ball 40 corresponds to a conductive member. However, the conductive member only needs to have conductivity, and is not limited to the solder ball 40. For example, the conductive member may be a resin-based conductive adhesive in which a conductive filler is mixed. Examples of the resin include epoxy resins, silicone resins, acrylic resins, and urethane resins. In addition, examples of the conductive material contained in the resin include Ag, Cu, Ni, Al, and Au. Similarly, in the first embodiment and each embodiment described later, the solder ball 63 corresponds to a conductive portion, but the conductive portion is not limited to the solder ball 63 as long as it has conductivity.

In the first embodiment, in plan view of the wiring board 10 as viewed from the lower surface 20A side of the insulating layer 20, the area of the solder ball 40 formed on the surface 30Ab of the electrode 30A is smaller than the area of the electrode 30A. However, the area of the solder ball 40 may be equal to or larger than the area of the electrode 30A.

In the first embodiment, in plan view of the wiring board 10 as viewed from the lower surface 20A side of the insulating layer 20, the entire portion of the solder ball 40 formed on the surface 30Ab of the electrode 30A overlaps the electrode 30A. However, only a part of the solder ball 40 formed on the surface 30Ab of the electrode 30A may overlap the electrode 30A.

In the first embodiment, the plurality of solder balls 40 have the same size, but the plurality of solder balls 40 may have different sizes. In the first embodiment, the plurality of solder balls 63 have the same size, but the plurality of solder balls 63 may have different sizes.

In the first embodiment, as illustrated in FIG. 2, one solder ball 40 is electrically connected to one electrode 30A or one electrode 30B, and one solder ball 63 is electrically connected to one electrode 30D. However, the plurality of solder balls 40 may be electrically connected to one electrode 30A or one electrode 30B. Similarly, a plurality of solder balls 63 may be electrically connected to one electrode 30D.

Figure 3:
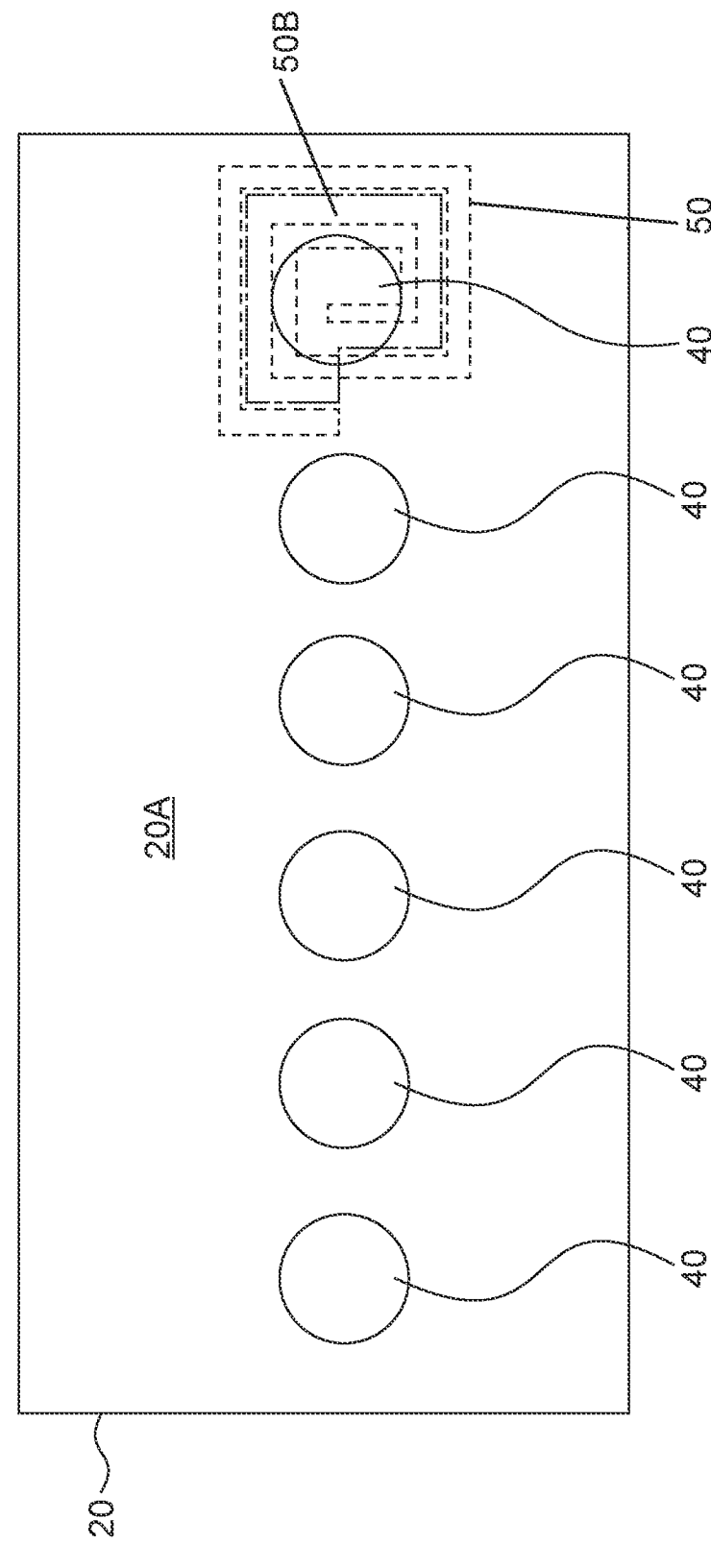
FIG. 3 is a bottom view of a modification of the wiring board according to the first embodiment of the present disclosure.

In the first embodiment, as illustrated in FIG. 1, the coil conductor 50 has a loop shape in plan view of the wiring board 10 as viewed from the lower surface 20A side of the insulating layer 20, but is not limited to the loop shape. FIG. 3 is a bottom view of a modification of the wiring board according to the first embodiment of the present disclosure. As illustrated in FIG. 3, the coil conductor 50 may have a spiral shape in the plan view. In this case, a region inside the outermost peripheral coil conductor 50 is the opening 50B of the coil conductor 50. That is, a region surrounded by an alternate long and short dash line in FIG. 3 is the opening 50B of the coil conductor 50.

In the first embodiment, as illustrated in FIG. 2, in plan view of the wiring board 10 as viewed from the lower surface 20A side of the insulating layer 20, the ground conductor 80 completely covers the opening 50B of the coil conductor 50 from above, but the ground conductor 80 may cover only a part of the opening 50B of the coil conductor 50 from above.

In the first embodiment, the ground conductor 80 is formed above the coil conductor 50 (on the upper surface 20B side of the insulating layer 20 with respect to the coil conductor 50), but may be formed below the coil conductor 50 (on the lower surface 20A side of the insulating layer 20 with respect to the coil conductor 50). In addition, the ground conductor 80 may be formed both above and below the coil conductor 50. In addition, the wiring board 10 may not include the ground conductor 80.

In the first embodiment, as illustrated in FIG. 2, two electronic components 60 (electronic components 61 and 62) are mounted on the upper surface 20B of the insulating layer 20. However, the number and positions of the electronic components 60 mounted on the wiring board 10 are not limited to the number and positions illustrated in FIG. 2. For example, one or three or more electronic components 60 may be mounted on the upper surface 20B of the insulating layer 20. In addition, for example, the electronic component 60 may be mounted on the lower surface 20A of the insulating layer 20, or may be mounted on both the upper surface 20B and the lower surface 20A of the insulating layer 20.

Second Embodiment

Figure 4:
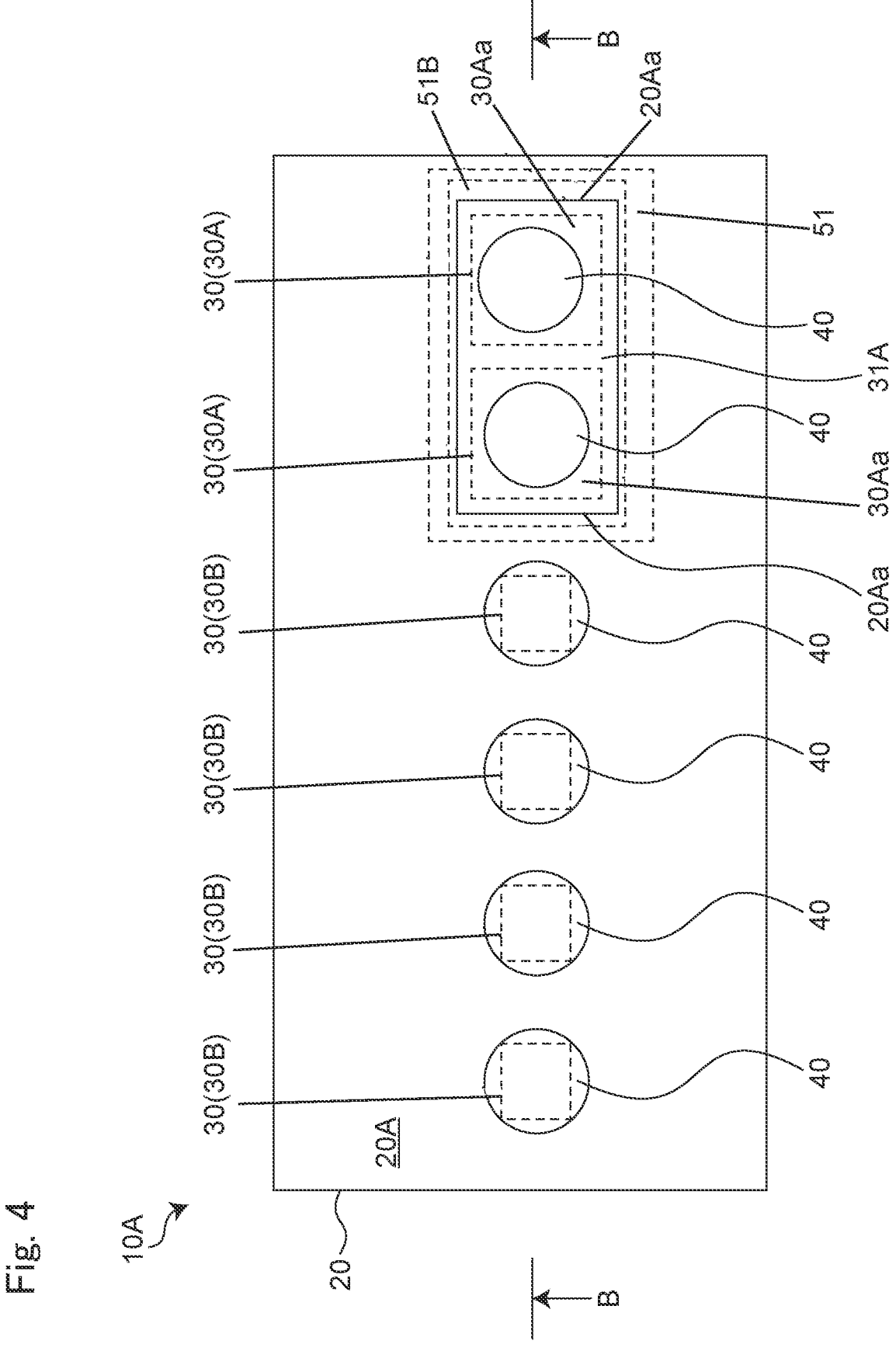
FIG. 4 is a bottom view of a wiring board according to a second embodiment of the present disclosure.
Figure 5:
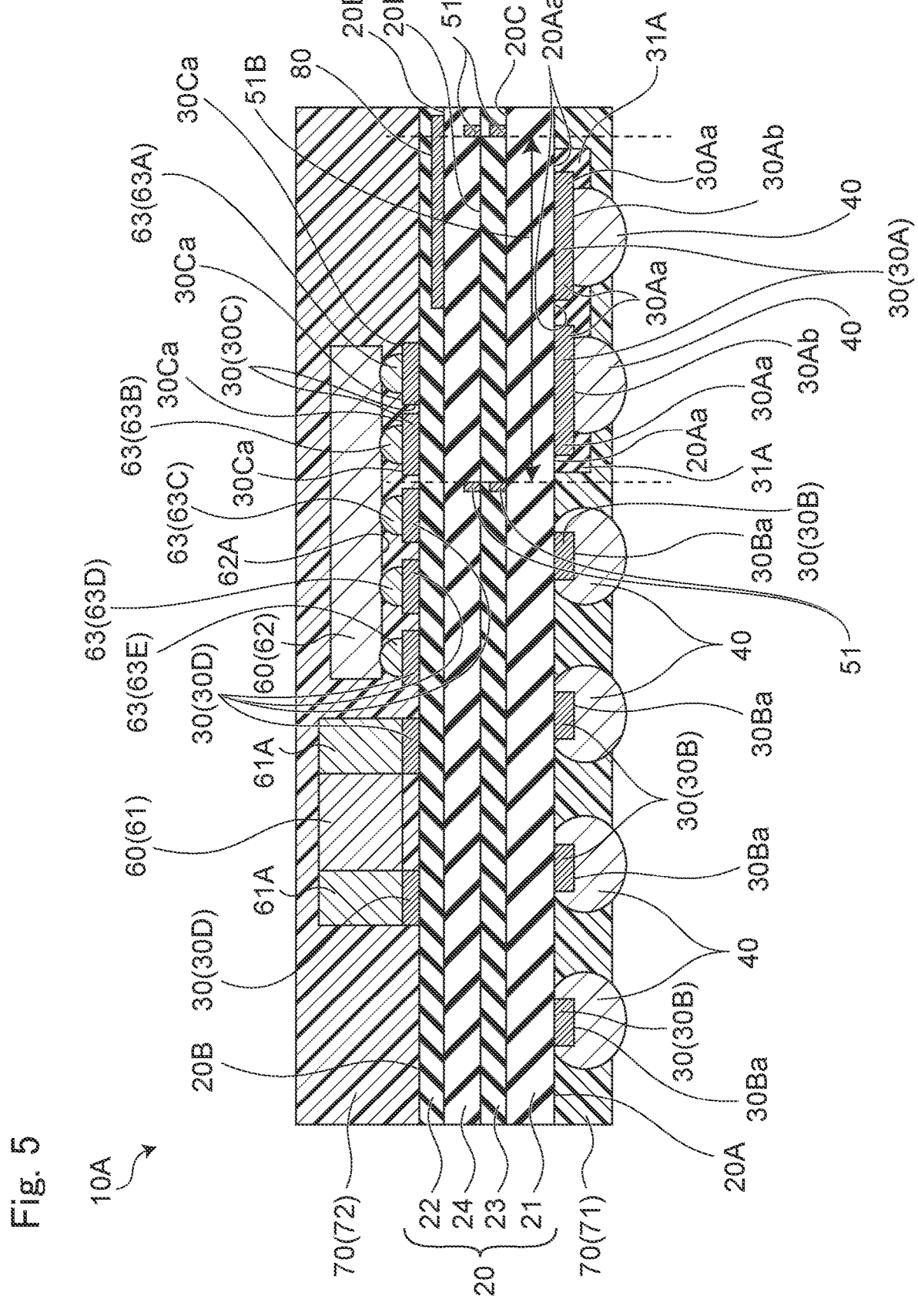
FIG. 5 is a cross-sectional view illustrating a cross section taken along line B-B in FIG. 4.

FIG. 4 is a bottom view of a wiring board according to a second embodiment of the present disclosure. FIG. 5 is a cross-sectional view illustrating a cross section taken along line B-B in FIG. 4. The wiring board 10A according to the second embodiment is different from the wiring board 10 according to the first embodiment in that the plurality of electrodes 30A overlap the coil conductor 51 in plan view of the wiring board 10A as viewed from the lower surface 20A side of the insulating layer 20. The wiring board 10A according to the second embodiment is different from the wiring board 10 according to the first embodiment in that the electronic component 62 overlaps the coil conductor 51 in plan view of the wiring board 10A as viewed from the upper surface 20B side of the insulating layer 20.

As illustrated in FIGS. 4 and 5, the wiring board 10A includes two electrodes 30A, four electrodes 30B, two electrodes 30C, and five electrodes 30D. The electrode 30C is an example of the third electrode. Note that the numbers of the electrodes 30A, 30B, 30C, and 30D are not limited to the numbers described above.

As in the first embodiment, in plan view of the wiring board 10A as viewed from the lower surface 20A side of the insulating layer 20, the area of the electrode 30A is larger than the area of the electrode 30B. In addition, in plan view of the wiring board 10A as viewed from the upper surface 20B side of the insulating layer 20, the area of the electrode 30C is larger than the area of the electrode 30D.

One insulating resist film 31A covers each of the outer edge portions 30Aa of the two electrodes 30A.

Each of the six solder balls 40 is formed on the surfaces 30Ab of the two electrodes 30A and the surfaces 30Ba of the four electrodes 30B.

The coil conductor 51 is configured similarly to the coil conductor 50 (see FIGS. 1 and 2). However, the coil conductor 51 is larger than the coil conductor 50 in plan view of the wiring board 10A as viewed from the lower surface 20A side of the insulating layer 20.

The coil conductor 51 has an opening 51B. The opening 51B is a region inside the coil conductor 51 having a loop shape in plan view of the wiring board 10A as viewed from the lower surface 20A side of the insulating layer 20.

In plan view of the wiring board 10A as viewed from the lower surface 20A side of the insulating layer 20, all of the two electrodes 30A are at positions overlapping the opening 51B of the coil conductor 51. On the other hand, in the plan view, the four electrodes 30B are at positions deviated from the opening 51B of the coil conductor 51. Note that, when the wiring board 10 includes three or more electrodes 30A, the number of electrodes 30A at positions overlapping the opening 51B in the plan view may be three or more.

In plan view of the wiring board 10A as viewed from the upper surface 20B side of the insulating layer 20, all of the two electrodes 30C are at positions overlapping the opening 51B of the coil conductor 51. On the other hand, in the plan view, the five electrodes 30D are at positions deviated from the opening 51B of the coil conductor 51. Note that when the wiring board 10 includes three or more electrodes 30C, the number of electrodes 30C at positions overlapping the opening 51B in the plan view may be three or more.

As illustrated in FIG. 5, in plan view of the wiring board 10A as viewed from the lower surface 20A side of the insulating layer 20, the ground conductor 80 covers only a part of the opening 51B of the coil conductor 51.

In the second embodiment, the electronic component 62 includes five solder balls 63. Among the five solder balls 63 included in the electronic component 62, two solder balls 63A and 63B are positioned to overlap the opening 51B of the coil conductor 51 in plan view of the wiring board 10A as viewed from the upper surface 20B side of the insulating layer 20. On the other hand, the remaining three solder balls 63C, 63D, and 63E among the five solder balls 63 included in the electronic component 62 are at positions deviated from the opening 51B of the coil conductor 51 in the plan view.

The solder balls 63A and 63B are electrically connected to the electrode 30C. The solder balls 63C, 63D, and 63E are electrically connected to the electrode 30D.

In plan view of the wiring board 10A as viewed from the upper surface 20B side of the insulating layer 20, the solder balls 63A and 63B are located inside an outer edge portion 30Ca of the electrode 30C. The outer edge portion 30Ca is a side of a square constituting the electrode 30C and a peripheral portion inside the side of the square in the plan view. That is, in the plan view, the area of each of the solder balls 63A and 63B connected to the electrode 30C is smaller than the area of the electrode 30C. In addition, in the plan view, the entire portions of the solder balls 63A and 63B formed in the electrode 30C overlap the electrode 30C.

Note that, in plan view of the wiring board 10A as viewed from the upper surface 20B side of the insulating layer 20, the area of each of the solder balls 63A and 63B may be equal to or larger than the area of the electrode 30C. In addition, in the plan view, only a part of the solder balls 63A and 63B may overlap the electrode 30C.

A part of the electronic component 62 overlaps the opening 51B of the coil conductor 51 in plan view of the wiring board 10A as viewed from the upper surface 20B side of the insulating layer 20. The electronic component 62 is an example of the overlapping component. Further, all of the electronic components 62 may overlap the opening 51B of the coil conductor 51 in the plan view.

The conductive portions 61A provided at the left and right ends of the electronic component 61 are electrically connected to the electrode 30D. The electronic component 61 is at a position deviated from the opening 51B of the coil conductor 51 in plan view of the wiring board 10A as viewed from the upper surface 20B side of the insulating layer 20. The electronic component 61 is an example of a non-overlapping component.

According to the second embodiment, when there is a variation in size of the solder ball 40 formed in each of the two electrodes 30A, it is possible to reduce the influence of the variation on the magnetic flux formed by the coil conductor 51.

According to the second embodiment, in plan view of the wiring board 10A as viewed from the upper surface 20B side of the insulating layer 20, the electrode 30C is at a position overlapping the opening 51B of the coil conductor 51. Therefore, the solder balls 63A and 63B connected to the electrode 30C can greatly affect the magnetic flux formed by the coil conductor 51. On the other hand, in the plan view, the electrode 30D is at a position deviated from the opening 50B of the coil conductor 51. Therefore, the solder balls 63C, 63D, and 63E connected to the electrode 30D do not greatly affect the magnetic flux formed by the coil conductor 51.

According to the second embodiment, in plan view of the wiring board 10A as viewed from the upper surface 20B side of the insulating layer 20, the area of the electrode 30C is larger than the area of the electrode 30D. Therefore, when the size of the solder balls 63 varies, the protrusion of the solder balls 63A and 63B connected to the electrode 30C to the outside of the electrode 30C can be reduced as compared with the protrusion of the solder balls 63C, 63D, and 63E connected to the electrode 30D to the outside of the electrode 30D. Therefore, it is possible to reduce the influence of the variation in size of the solder balls 63A and 63B on the magnetic flux formed by the coil conductor 51.

According to the second embodiment, in plan view of the wiring board 10A viewed from the upper surface 20B side of the insulating layer 20, the area of the solder ball 63 formed in the electrode 30C is smaller than the area of the electrode 30C. Therefore, the solder ball 63 is less likely to be located outside the electrode 30C as viewed from the coil conductor 51. Therefore, it is possible to reduce the influence of the variation in size of the solder ball 63 on the magnetic flux formed by the coil conductor 51.

According to the second embodiment, when viewed from the coil conductor 51, the entire portion of the solder balls 63A and 63B are located behind the electrode 30C. Therefore, it is possible to reduce the influence of the variation in size of the solder balls 63A and 63B on the magnetic flux formed by the coil conductor 51.

In the second embodiment, as illustrated in FIG. 4, in plan view of the wiring board 10A as viewed from the lower surface 20A side of the insulating layer 20, all of the two electrodes 30A are at positions overlapping the opening 51B of the coil conductor 51. However, as described in detail below, in the plan view, only a part of the electrode 30A may be at a position overlapping the opening 51B of the coil conductor 51.

In the second embodiment, the ground conductor 80 covers only a part of the opening 51B of the coil conductor 51, but may cover the entire opening 51B.

Figure 6:
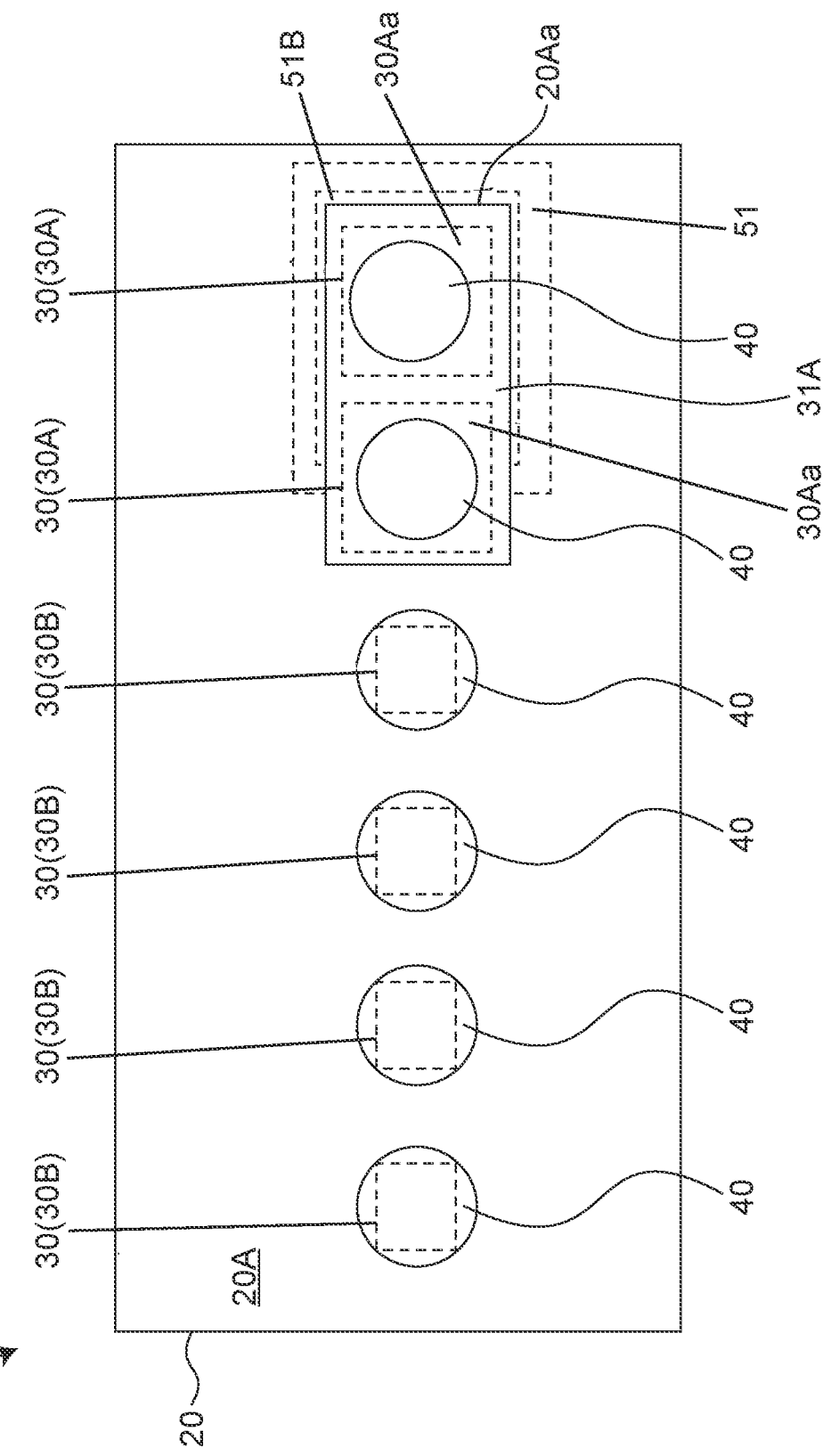
FIG. 6 is a bottom view of a modification of the wiring board according to the second embodiment of the present disclosure.

FIG. 6 is a bottom view of a modification of the wiring board according to the second embodiment of the present disclosure. For example, as illustrated in FIG. 6, in plan view of the wiring board 10A as viewed from the lower surface 20A side of the insulating layer 20, while all of the electrodes 30A of the two electrodes 30A may be at positions overlapping the opening 51B of the coil conductor 51, only a part of the other electrode 30A of the two electrodes 30A may be at a position overlapping the opening 51B of the coil conductor 51. Of course, in the plan view, only a part of each of the two electrodes 30A may be at a position overlapping the opening 51B of the coil conductor 51. In addition, similarly to the electrode 30A, in plan view of the wiring board 10A as viewed from the upper surface 20B side of the insulating layer 20, only a part of the electrode 30C may be at a position overlapping the opening 51B of the coil conductor 51.

In the second embodiment, as illustrated in FIG. 4, one resist film 31A covers the outer edge portions 30Aa of the two electrodes 30A, and the solder ball 40 is formed on each of the two electrodes 30A. However, in a case where a plurality of solder balls 40 are electrically connected to the same electrode 30A, a configuration as illustrated in FIG. 7 may be adopted as described in detail below.

Figure 7:
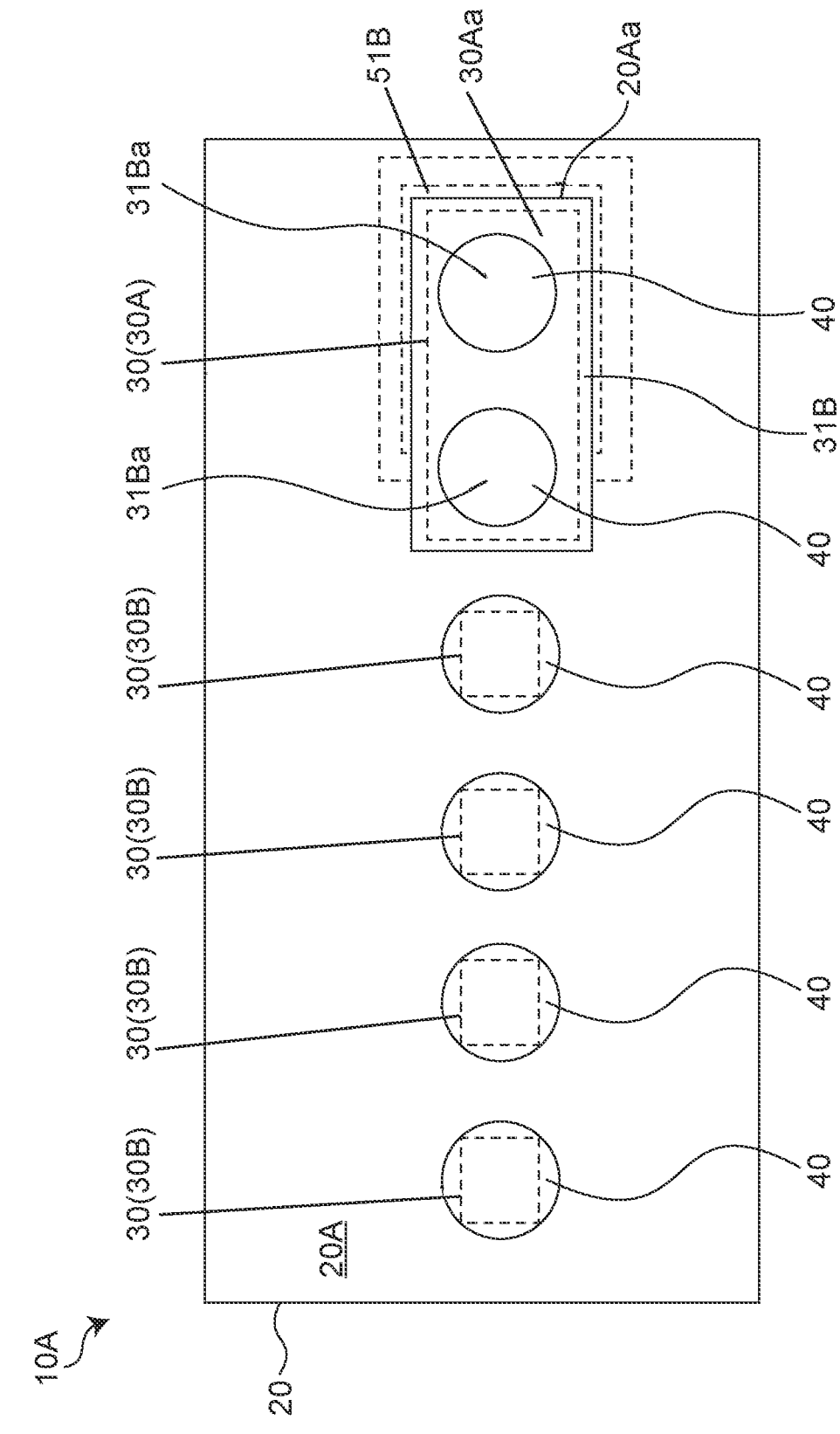
FIG. 7 is a bottom view of a modification of the wiring board according to the second embodiment of the present disclosure.

FIG. 7 is a bottom view of a modification of the wiring board according to the second embodiment of the present disclosure. As illustrated in FIG. 7, one resist film 31B covering one electrode 30A may have a plurality of (two in FIG. 7) openings 31Ba. In this case, the solder ball 40 is formed in each of the two openings 31Ba. As a result, the two solder balls 40 are electrically connected to the same electrode 30A. Note that, when the other electrodes 30B, 30C, and 30D are covered with the resist film, the resist film may have a plurality of openings as in the configuration described above.

Third Embodiment

Figure 8:
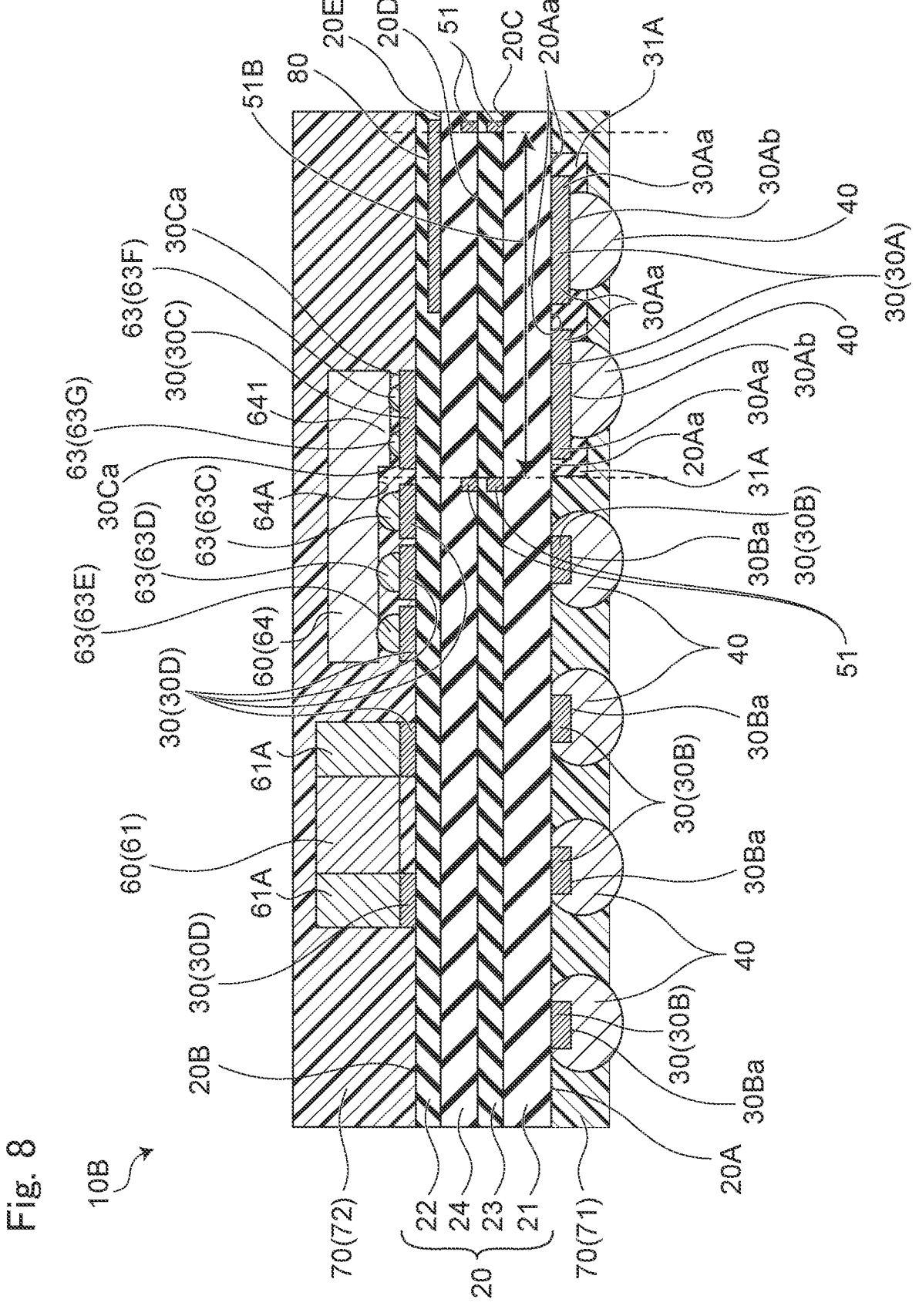
FIG. 8 is a cross-sectional view illustrating a cross section of a wiring board according to a third embodiment of the present disclosure at a position corresponding to a B-B cross section in FIG. 4.

FIG. 8 is a cross-sectional view illustrating a cross section of the wiring board according to a third embodiment of the present disclosure at a position corresponding to the B-B cross section in FIG. 4. A wiring board 10B according to the third embodiment is different from the wiring board 10A according to the second embodiment in that an electronic component 64 is provided instead of the electronic component 62.

In the third embodiment, the electronic component 64 includes five solder balls 63. The five solder balls 63 are solder balls 63C, 63D, 63E, 63F, and 63G. That is, the electronic component 64 is different from the electronic component 62 (see FIG. 5) in that the electronic component 64 includes the solder balls 63F and 63G instead of the solder balls 63A and 63B.

The solder balls 63F and 63G are at positions overlapping the opening 51B of the coil conductor 51 in plan view of the wiring board 10B as viewed from the upper surface 20B side of the insulating layer 20. That is, a part of the electronic component 64 overlaps the opening 51B of the coil conductor 51 in the plan view. The electronic component 64 is an example of the overlapping component. On the other hand, similarly to the second embodiment, the solder balls 63C, 63D, and 63E are at positions deviated from the opening 51B of the coil conductor 51 in the plan view.

The solder balls 63F and 63G are electrically connected to the electrode 30C. Similarly to the second embodiment, the solder balls 63C, 63D, and 63E are electrically connected to the electrode 30D.

Each of the solder balls 63F and 63G is smaller than each of the solder balls 63C, 63D, and 63E. The solder ball 63 has a substantially spherical shape. Therefore, in plan view of the wiring board 10B viewed from the upper surface 20B side of the insulating layer 20, the area of each of the solder balls 63F and 63G is smaller than the area of each of the solder balls 63C, 63D, and 63E.

In the third embodiment, the electronic component 64 includes a protrusion 641 in order to align the lower end portions of the solder balls 63F and 63G and the solder balls 63C, 63D, and 63E having different sizes in the vertical direction. The protrusion 641 protrudes downward from a lower surface 64A of the electronic component 64. The solder balls 63F and 63G are formed on the tip surface of the protrusion 641 (the lower surface of the protrusion 641). As a result, the lower ends of the solder balls 63F and 63G are positioned downward by the amount corresponding to the protrusion 641. On the other hand, the solder balls 63C, 63D, and 63E are formed on the lower surface 64A. The protrusion length of the protrusion 641 is substantially the same as the difference between the diameters of the solder balls 63C, 63D, and 63E and the diameters of the solder balls 63F and 63G. Therefore, since the solder balls 63F and 63G are formed on the protrusion 641, the position of the lower end portions of the solder balls 63F and 63G in the vertical direction are substantially the same as the positions of the lower end portions of the solder balls 63C, 63D, and 63E in the vertical direction.

The configuration for aligning the lower end portions of the solder balls 63F and 63G and the solder balls 63C, 63D, and 63E having different sizes in the vertical direction is not limited to the protrusion 641. For example, the electronic component 64 may include a recess on the lower surface of the electronic component 64, and the solder balls 63C, 63D, and 63E may be formed in the recess.

According to the third embodiment, in plan view of the wiring board 10B as viewed from the upper surface 20B side of the insulating layer 20, the electrode 30C is at a position overlapping the opening 51B of the coil conductor 51. Therefore, the solder balls 63F and 63G connected to the electrode 30C can greatly affect the magnetic flux formed by the coil conductor 51. On the other hand, in the plan view, the electrode 30D is at a position deviated from the opening 51B of the coil conductor 51. Therefore, the solder balls 63C, 63D, and 63E connected to the electrode 30D do not greatly affect the magnetic flux formed by the coil conductor 51.

According to the third embodiment, in plan view of the wiring board 10B as viewed from the upper surface 20B side of the insulating layer 20, the area of each of the solder balls 63F and 63G connected to the electrode 30C is smaller than the area of each of the solder balls 63C, 63D, and 63E connected to the electrode 30D. Therefore, when there is a variation in size of the solder ball 63, the variation in size of the solder balls 63F and 63G connected to the electrode 30C can be made smaller than the variation in size of the solder balls 63C, 63D, and 63E connected to the electrode 30D. Therefore, it is possible to reduce the influence of the variation in size of the solder balls 63F and 63G on the magnetic flux formed by the coil conductor 51.

In the third embodiment, the ground conductor 80 covers only a part of the opening 51B of the coil conductor 51, but may cover the entire opening 51B.

Fourth Embodiment

Figure 9:
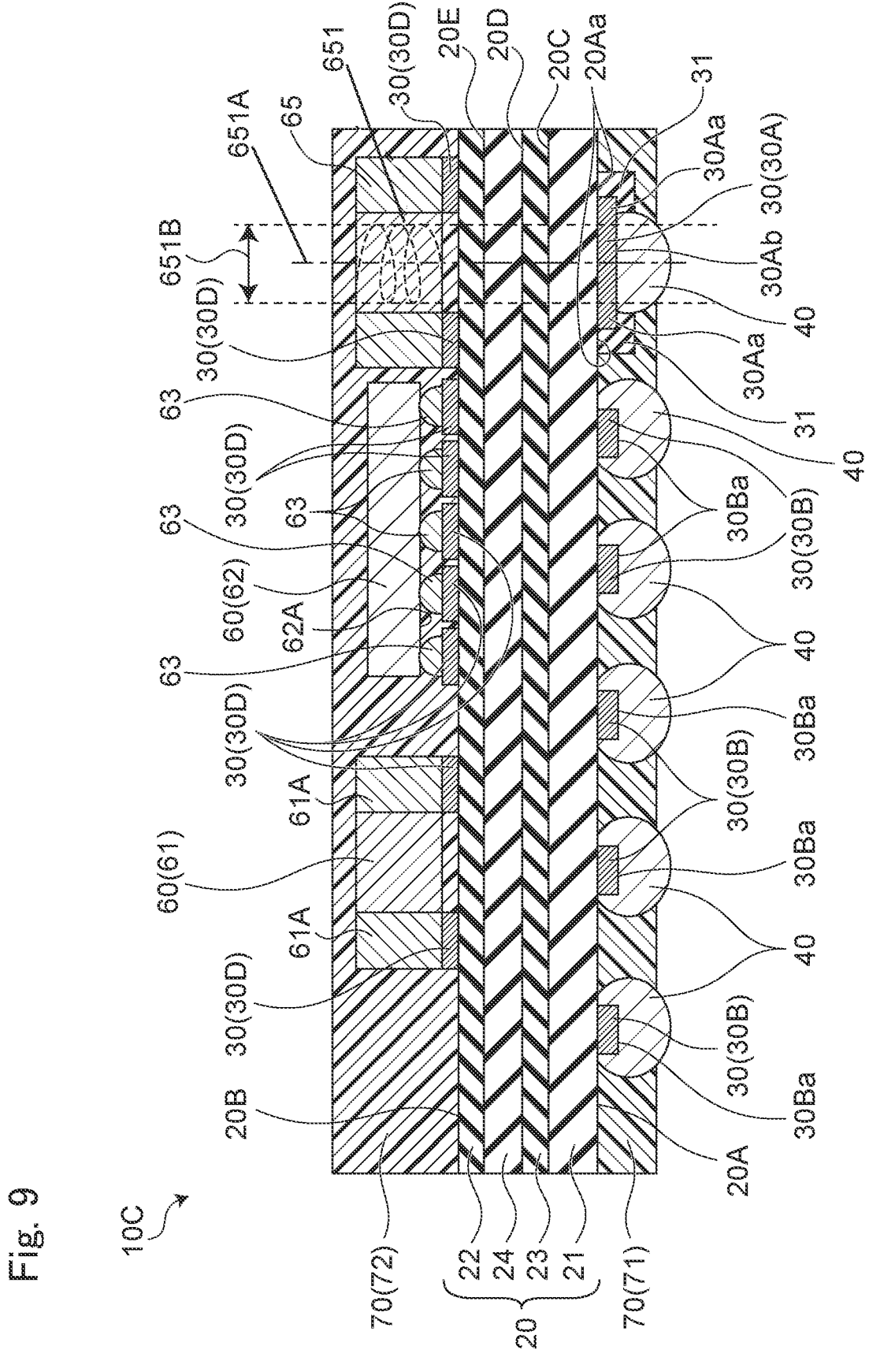
FIG. 9 is a cross-sectional view illustrating a cross section of a wiring board according to a fourth embodiment of the present disclosure at a position corresponding to an A-A cross section in FIG. 1.

FIG. 9 is a cross-sectional view illustrating a cross section of a wiring board according to a fourth embodiment of the present disclosure at a position corresponding to an A-A cross section in FIG. 1. A wiring board 10C according to the fourth embodiment is different from the wiring board 10 according to the first embodiment in that an electronic component 65 as a coil conductor is provided instead of the coil conductor 50.

The wiring board 10C includes, as the electronic component 60, the electronic component 65 in addition to the electronic components 61 and 62. The electronic component 65 is mounted on the upper surface 20B of the insulating layer 20. The electronic component 65 has a coil 651 therein. That is, in the fourth embodiment, the electronic component 65 corresponds to a coil conductor.

Although not illustrated, one end portion and the other end portion of the coil 651 are electrically connected to the electrode 30D formed on the upper surface 20B of the insulating layer 20 of the wiring board 10C.

A winding axis 651A of the coil 651 intersects the lower surface 20A and the upper surface 20B of the insulating layer 20.

The coil 651 has an opening 651B. The opening 651B is a region inside the coil 651 having a loop shape in plan view of the wiring board 10 as viewed from the lower surface 20A side of the insulating layer 20.

In plan view of the wiring board 10C as viewed from the lower surface 20A side of the insulating layer 20, a part of the electrode 30A is at a position overlapping the opening 651B of the coil 651. Note that, in the plan view, the entire electrode 30A may be located at a position overlapping the opening 651B of the coil 651.

Note that, by appropriately combining arbitrary embodiments among the various embodiments described above, the effects of the respective embodiments can be achieved.

Although the present disclosure has been sufficiently described in connection with preferred embodiments with reference to the drawings as appropriate, various modifications and corrections are apparent to those skilled in the art. Such variations and modifications should be understood to be included within the scope of the present disclosure according to the appended claims as long as they do not depart therefrom.

10 wiring board
20 insulating layer
20A lower surface (first surface)
20B upper surface (second surface)
30 land electrode
30A electrode (first electrode)
30Aa outer edge portion
30Ab surface
30B electrode (second electrode)
30Ba surface
30C electrode (third electrode)
30D electrode (fourth electrode)
31 resist film (covering portion)
40 solder ball (conductive member)
50 coil conductor
50A winding axis
50B opening
60 electronic component
61 electronic component (non-overlapping component)
62 electronic component (overlapping component)
63 solder ball (conductive portion)
71 sealing resin (first sealing resin)
72 sealing resin (second sealing resin)

What is claimed is:

1. A wiring board comprising:
at least one insulating layer having a first surface and a second surface opposite to the first surface;
a plurality of land electrodes formed on the first surface of the insulating layer;
a conductive member formed on a surface of at least one of the plurality of land electrodes; and
a coil conductor provided inside the insulating layer or on the second surface of the insulating layer and having a winding axis intersecting the first surface, wherein
the plurality of land electrodes comprise:
at least one first electrode located at a position where at least a part of the first electrode overlaps an opening of the coil conductor in plan view seen from a first surface side; and
a second electrode located at a position deviated from the opening of the coil conductor in plan view seen from the first surface side, and wherein
an area of the first electrode is larger than an area of the second electrode in plan view seen from the first surface side.

2. The wiring board of claim 1, wherein
in plan view seen from the first surface side, an area of the conductive member formed on a surface of the first electrode is smaller than an area of the first electrode.

3. The wiring board of claim 2, wherein
in plan view seen from the first surface side, an entire portion of the conductive member formed on the surface of the first electrode overlap the first electrode.

4. The wiring board of claim 3, further comprising:
an insulating covering portion covering an outer edge portion of the first electrode in plan view seen from the first surface side, wherein
the conductive member is surrounded by the covering portion in the first electrode in plan view seen from the first surface side.

5. The wiring board of claim 3, wherein
the at least one first conductive member comprises a plurality of first electrodes at positions overlapping the opening of the coil conductor in plan view seen from the first surface side.

6. The wiring board of claim 3, further comprising:
a first sealing resin provided on the first surface of the insulating layer and covering a part of the conductive member.

7. The wiring board of claim 2, further comprising:
an insulating covering portion covering an outer edge portion of the first electrode in plan view seen from the first surface side, wherein
the conductive member is surrounded by the covering portion in the first electrode in plan view seen from the first surface side.

8. The wiring board of claim 2, wherein
the at least one first conductive member comprises a plurality of first electrodes at positions overlapping the opening of the coil conductor in plan view seen from the first surface side.

9. The wiring board of claim 2, further comprising:
a first sealing resin provided on the first surface of the insulating layer and covering a part of the conductive member.

10. The wiring board of claim 1, further comprising:
an insulating covering portion covering an outer edge portion of the first electrode in plan view seen from the first surface side, wherein
the conductive member is surrounded by the covering portion in the first electrode in plan view seen from the first surface side.

11. The wiring board of claim 10, wherein
the at least one first conductive member comprises a plurality of first electrodes at positions overlapping the opening of the coil conductor in plan view seen from the first surface side.

12. The wiring board of claim 1, wherein
the at least one first conductive member comprises a plurality of first electrodes at positions overlapping the opening of the coil conductor in plan view seen from the first surface side.

13. The wiring board of claim 1, further comprising:
a first sealing resin provided on the first surface of the insulating layer and covering a part of the conductive member.

14. The wiring board of claim 1, further comprising:
at least one electronic component mounted on the second surface of the insulating layer.

15. The wiring board of claim 14, further comprising:
a second sealing resin provided on the second surface of the insulating layer and covering at least a part of the electronic component.

16. The wiring board of claim 14, wherein the coil conductor is provided inside the insulating layer, and wherein the electronic component is located at a position deviated from the opening of the coil conductor in plan view seen from a second surface side.

17. The wiring board of claim 14, wherein the coil conductor is provided inside the insulating layer wherein the electronic component comprises:

an overlapping component at least partially overlapping the opening of the coil conductor in plan view seen from a second surface side, and a non-overlapping component located at a position deviated from the opening of the coil conductor in plan view seen from the second surface side wherein each of the overlapping component and the non-overlapping component comprises at least one conductive portion exposed to an outside wherein the plurality of land electrodes further comprise:

a third electrode formed on the second surface of the insulating layer, located at a position overlapping the opening of the coil conductor in plan view seen from the second surface side, and connected with the conductive portion of the overlapping component; and a fourth electrode formed on the second surface of the insulating layer, located at a position deviated from the opening of the coil conductor in plan view seen from the second surface side, and connected with the conductive portion of the overlapping component or the conductive portion of the non-overlapping component located at a position deviated from the opening of the coil conductor in the conductive portion of the overlapping component, and wherein in plan view seen from the second surface side, an area of the third electrode is larger than an area of the fourth electrode.

18. The wiring board of claim 17, wherein in plan view seen from the second surface side, an area of the conductive portion connected to the third electrode is smaller than an area of the third electrode.

19. The wiring board of claim 18, wherein in plan view seen from the second surface side, an entire portion of the conductive portion connected to the third electrode overlaps the third electrode.

20. The wiring board of claim 14, wherein the coil conductor is provided inside the insulating layer wherein the electronic component comprises:

an overlapping component at least partially overlapping the opening of the coil conductor in plan view seen from a second surface side, and a non-overlapping component located at a position deviated from the opening of the coil conductor in plan view seen from the second surface side wherein each of the overlapping component and the non-overlapping component comprises at least one conductive portion exposed to an outside wherein the plurality of land electrodes further comprise:

a third electrode formed on the second surface of the insulating layer, located at a position overlapping the opening of the coil conductor in plan view seen from the second surface side, and connected with the conductive portion of the overlapping component; and a fourth electrode formed on the second surface of the insulating layer, located at a position deviated from the opening of the coil conductor in plan view seen from the second surface side, and connected with the conductive portion of the overlapping component or the conductive portion of the non-overlapping component located at a position deviated from the opening of the coil conductor in the conductive portion of the overlapping component and wherein in plan view seen from the second surface side, an area of the conductive portion connected to the third electrode is smaller than an area of the conductive portion connected to the fourth electrode.

* * * * *